United States Patent
Qawami et al.

(10) Patent No.: US 7,191,295 B2
(45) Date of Patent: Mar. 13, 2007

(54) SENSING WORD GROUPS IN A MEMORY

(75) Inventors: Shekoufeh Qawami, El Dorado Hills, CA (US); Chaitanya S. Rajguru, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 10/610,478

(22) Filed: Jun. 30, 2003

(65) Prior Publication Data

US 2004/0268075 A1 Dec. 30, 2004

(51) Int. Cl.
*G06F 12/00* (2006.01)

(52) U.S. Cl. .......................... 711/150; 711/151; 711/5; 365/230.01

(58) Field of Classification Search .................. 711/5, 711/1, 100, 151, 150; 365/189.05, 230.06, 365/230.01, 230.03, 230.05
See application file for complete search history.

(56) References Cited

U.S. PATENT DOCUMENTS

| | | | |
|---|---|---|---|
| 5,784,331 A * | 7/1998 | Lysinger | 365/230.06 |
| 6,212,121 B1 * | 4/2001 | Ryu et al. | 365/230.01 |
| 6,216,180 B1 | 4/2001 | Kendall et al. | 710/35 |
| 6,366,497 B1 | 4/2002 | Guliani et al. | 365/185.21 |
| 6,425,062 B1 | 7/2002 | Kendall et al. | 711/167 |
| 6,456,540 B1 | 9/2002 | Baltar et al. | 365/189.09 |
| 6,914,830 B2 * | 7/2005 | Merritt et al. | 365/189.05 |
| 6,920,534 B2 * | 7/2005 | Dover | 711/151 |
| 2004/0019756 A1 * | 1/2004 | Perego et al. | 711/170 |
| 2005/0135148 A1 * | 6/2005 | Chevaillier et al. | 365/171 |

OTHER PUBLICATIONS

Gerstner et al., "Nonvolatile memory effects in nitrogen doped tetrahedral amorphous carbon thin films", 1998, Journal of Applied Physics, vol. 84, No. 10, pp. 5647-5651.*
U.S. Appl. No. 10/183,234, filed Jun. 26, 2002, Qawami et al.

* cited by examiner

*Primary Examiner*—Pierre-Michel Bataille
(74) *Attorney, Agent, or Firm*—Trop, Pruner & Hu, P.C.

(57) ABSTRACT

In one embodiment of the present invention, a method includes sensing a first burst length of data equal to half of a sense width of a plurality of sense amplifiers of a memory, and sensing a second burst length of data equal to the half of the sense width during a latency while sensing the first burst length of data.

25 Claims, 3 Drawing Sheets

SENSING WORD GROUPS IN A MEMORY

BACKGROUND

Certain nonvolatile memories, such as a synchronous flash memory, that support "burst" data have a sense circuit that senses all data within a maximum non-continuous burst length at one time and places the data in an output buffer. On such devices, once an address is supplied to the device, it will wait for some initial latency count while all burst data starting from the initial address is sensed and transferred to the output buffer. The data is then output one unit per clock cycle until all sensed data is transferred to the requester.

In cases where the burst length requested by a memory controller is half of the sense width of the memory, half of the sensed data is not used by the controller. Even with address pipelining, if the initial latency count is more than the burst length, there are wasted bus cycles. Thus, there is a need for alternate ways to retrieve information from memory.

DETAILED DESCRIPTION

Figure 1:
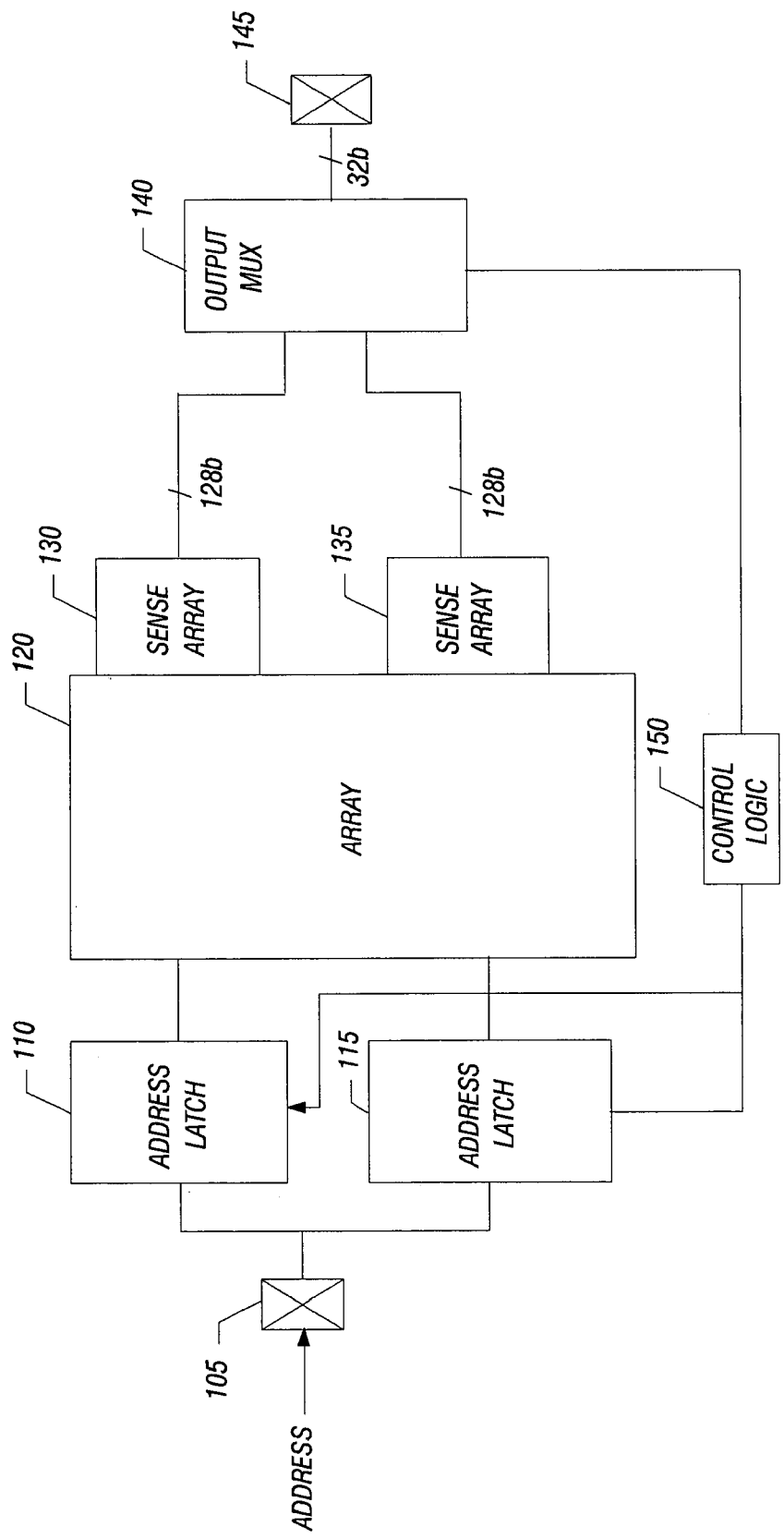
FIG. 1 is a block diagram of a memory device read path in accordance with one embodiment of the present invention.

Turning to FIG. 1, shown is a block diagram of a memory device read path in accordance with one embodiment of the present invention. As shown in FIG. 1, a memory device may include an input stage 105, address latches 110 and 115, control logic 150, a buffer or output multiplexer 140, an output stage 145, sense arrays 130 and 135, and a memory array 120.

Address latches 110 and 115 and output multiplexer 140 may temporarily store information. As used herein, the terms "information" and "data" may be used interchangeably, and may refer to both data and instructions. Address latches 110 and 115 and output multiplexer 140 may be, for example, registers, queues, or latches, although the scope of the present invention is not limited in this respect. Output multiplexer 140 may be adapted to store 256 bits of information, although the scope of the present invention is not limited in this respect. As shown in the embodiment of FIG. 1, output multiplexer 140 may output 32 bytes of information.

In alternate embodiments, output multiplexer 140 may be adapted to store more or less than 256 bits of information. While shown as a single structure in FIG. 1, in other embodiments dedicated output buffers corresponding to sense arrays 130 and 135 respectively, may be provided.

Address latches 110 and 115 may receive read requests from a memory controller (not shown in FIG. 1) via input stage 105. These requests may specify the amount of information to be retrieved from memory array 120 and may also include an address or addresses of the storage locations of the requested information in memory array 120.

After receiving read requests, sense arrays 130 and 135 may be used to sense the information at the requested addresses in memory array 120. Sense arrays 130 and 135 may include, for example, sense amplifiers (not shown) to sense the information stored in memory array 120. As shown in FIG. 1, each sense array may output 128 bits, although the scope of the present invention is not limited in this regard. While shown in FIG. 1 as separate arrays, it is to be understood that while logically separate, in various embodiments such arrays may be a single physical structure having a plurality of sense amplifiers and appropriate routing circuitry to sense information from different initial addresses. Both sense arrays 130 and 135 may be configured to be used together to sense 256 bits of continuous data, or separately to sense 128 bits of data from two different addresses, although the scope of the present invention is not limited in this regard.

After sensing the requested information from memory array 120, this information may be transferred to output multiplexer 140. The retrieved information may be transmitted from output multiplexer 140 via output stage 145 to a processor for use therein.

Control logic 150 may include circuitry to control the accessing and retrieval of information from memory array 120. For example, control logic 150 may be adapted to receive control, data, and/or address signals from a memory controller of a host system. In some embodiments, control logic 150 may decode a received address, store the decoded address in address latches 110 and 115, enable sense arrays 130 and 135 to sense information stored at the decoded address in memory array 120, and transfer the sensed information to output multiplexer 140. In certain embodiments, control logic 150 may also determine which address latch is enabled for a given sense operation, for example, by determining which latch has a valid address for read sensing. In certain embodiments, two read-state machine (RSM) latency counters may be used to keep track of two overlapping sense operations. In the embodiment of FIG. 1, such RSM counters may be implemented in control logic 150.

Thus in certain embodiments, a bus data rate may be improved by separating a sense array (logically and/or physically) to sense data from more than one non-contiguous initial address. The bus rate may be optimized when a burst length requested by the controller is half of the sense width, in certain embodiments. For example in one embodiment, a 256 bit sense array may sense two word groups, each four double words long, and each from a different initial address. In such an embodiment, the two requests may be separated by four clock cycles, and half of the sense amplifiers in the array may be selected to sense each request. However, the scope of the present invention is not so limited, and in other embodiments a word group may be two or more units of data.

A memory device in accordance with one embodiment of the present invention may perform synchronous burst read operations. A synchronous read operation may refer to synchronously reading information from the memory device using a clock signal of a host system. That is, information may be synchronously transmitted between a processor, a memory controller, and the memory device using a common reference clock. A burst read may refer to retrieving more than one unit of data in response to a single read request. A unit of data may be a byte of data, a word of data, or a double word of data. It should be noted that the terms "byte," "word," "double word," are terms denoting different units of data. As an example, in certain embodiments a byte of data may refer to eight bits of data, a word may refer to 16 bits of data, and a double word may refer to 32 bits of data, although the scope of the present invention is not limited in this regard.

Figure 2:
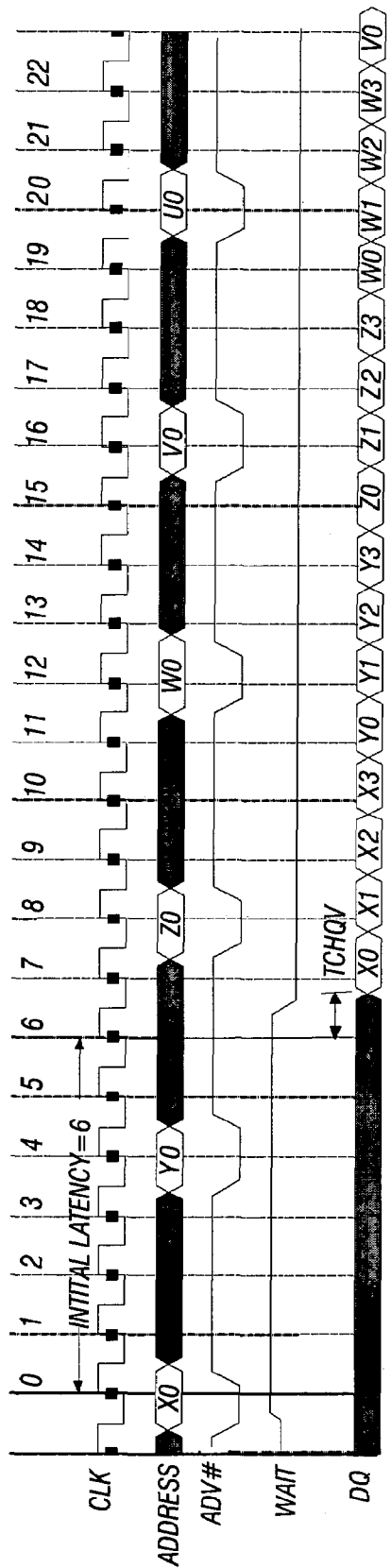
FIG. 2 is a timing diagram of synchronous burst read operations in accordance with one embodiment of the present invention.

Referring now to FIG. 2, shown is a timing diagram illustrating synchronous burst read requests to retrieve information from a memory device in accordance with an embodiment of the present invention. The timing diagram of FIG. 2 illustrates the relative timing of signals Clock (CLK), ADDRESS, Address Valid (ADV#), WAIT, and Data (DQ) that may be transferred between a memory controller and a memory device.

In this embodiment, twenty-two clock cycles of a clock signal (labeled CLK) are illustrated. Address signals (labeled ADDRESS) may be transmitted to a memory device from a memory controller using a bus. As shown in FIG. 2, read requests may be initiated every four clock cycles (respectively, cycles 0, 4, 8, 12, 16 and 20). In some embodiments, these read requests may be initiated by a processor of a host system and transferred to a memory controller at substantially the same time or at different times. In response, the memory controller may control when these read requests are transferred to the memory device.

In this embodiment, fixed-length synchronous burst read operations are illustrated, in that a fixed number of words are requested during each read request. For example, initial read request X0 at clock cycle 0 requests the retrieval of four double words of information from addresses X0 through X3, respectively. In this example, one double word of information is located at each address. Similarly, the second read request (Y0) at clock cycle 4 requests four double words of information respectively from addresses Y0 through Y3, and so forth for additional read requests.

The read requests may be referred to as burst read requests since more than one unit of data is transmitted from the memory device in response to a single read request. However, the amount of information retrieved in response to a single read request is not limited in this respect. Although four double word synchronous burst reads are illustrated in the timing diagram of FIG. 2, other fixed-length synchronous burst reads may be realized in other embodiments. In addition, continuous synchronous burst read operations, rather than fixed-length operations, may be implemented in other embodiments.

The Valid Address signal (labeled ADV#) may be transmitted to the memory device and may indicate that a valid address is available on the ADDRESS signal line.

During operation of a host system, read requests may be transferred from a memory controller to the memory device via a bus. In various embodiments, read requests may be received via input stage 105 at address latches 110 and 115 and/or control logic 150. In some embodiments, after receiving read requests, control logic 150 may enable retrieval of the information from memory array 120. For example, control logic 150 may enable sensing of word groups, such as four double word groups of information located at two different initial addresses of memory array 120. Sense arrays 130 and 135 may each sense the four double words of information from these locations, and control logic 150 may enable transfer of this information to output multiplexer 140. In alternate embodiments, control logic 150 may enable sense arrays 130 and 135 to sense eight double words from a single initial address.

The amount of time to retrieve information from memory device 140 in response to a read request may be referred to as a latency time or latency count and may be measured in terms of clock cycles of signal CLK. The latency count may be based on factors such as, for example, the processing speed of the memory device and other characteristics of the components of the memory device. In some embodiments, the time to retrieve information from a memory device in response to a read request may be programmable.

In the embodiment illustrated in FIG. 2, the latency count is six clock cycles of signal CLK. In other words, at least six clock cycles after receiving read request X0, the double word of information stored at address location X0 is transferred out of the memory device via output stage 145 on the DQ signal line. In the embodiment of FIG. 2, the WAIT signal may indicate (on a transition to logic low), the presence of valid data on the DQ line. Similarly, the time interval $T_{Chqv}$ may indicate the interval of time from the sixth clock cycle until the presence of valid data.

In the embodiment of FIG. 2, during the six clock cycles after receiving the X0 read request, the following may occur with respect to this read request: control logic 150 may decode the received addresses; sense array 130 may sense four double words of information respectively located at addresses X0 to X3; control logic 150 may enable transferring of the sensed four double words to output multiplexer 140; and control logic 150 may enable transferring of the first double word of information associated with address X0 from output multiplexer 140.

In the embodiment of FIG. 2, in response to read request Y0, information may be sensed by sense array 135 overlapping with the sensing of least part of the information in response to read request X0 by sense array 130. Such sensing of the Y0 request may continue while information retrieved in response to read request X0 is transferred out of the memory device. As soon as sense array 130 has completed sensing data for read request X0, it may start sensing data for the next read request Z0. This may be referred to as pipelining or a pipelining process. In certain embodiments, the WAIT signal may comprehend multiple pipelined read cycles being requested, and may provide the appropriate value (i.e., high or low) to indicate data validity/invalidity. In such embodiments, the WAIT signal may be dependent upon, for example, the initial latency, read request timing (i.e., ADV# pulses), and addressing.

In the embodiment of FIG. 2, the four double words retrieved in response to read request Y0 are transferred from the memory device directly following the information transferred in response to the X0 read request. In other words, no invalid data or wait states appear on the bus between the information output in response to read requests X0 and Y0.

The reading of information as shown in FIG. 2 may be referred to as optimal pipelining. The term optimal pipelining may refer to the process of issuing at least two read requests, where the subsequent request is transferred to the memory at a predetermined time so that all the requested information is output in response to the initial request and all the information in response to the subsequent request is output from the memory directly following the information retrieved in response to the initial request. In the embodiment of FIG. 2, optimal pipelining is achieved by transferring read request Y0 to memory array 120 four clock cycles after read request X0.

The memory device of FIG. 1 may be adapted to store information such as, for example, instructions or data used by an operating system or a software program that may be executed by a processor. In some embodiments, a memory device may be a volatile memory such as, for example, a static random access memory (SRAM) or a dynamic random access memory (DRAM), although the scope of the claimed subject matter is not limited in this respect. In alternate embodiments, the memory device may be a nonvolatile memory such as, for example, an electrically programmable read-only memory (EPROM), an electrically erasable and programmable read only memory (EEPROM), a flash memory (NAND or NOR type, including multiple bits per cell), a ferroelectric random access memory (FRAM), a disk memory such as, for example, an electromechanical hard disk, an optical disk, a magnetic disk, or any other device capable of storing instructions and/or data. Other types of nonvolatile memory are also within the scope of the claimed subject matter, including volatile memory with a battery backup, as the battery may prevent the memory from losing its contents when the main power source is off.

Further, embodiments may be implemented in a computer program, and stored on a storage medium (such as those described above) having stored thereon instructions which can be used to program a computer system, wireless device or the like to perform the embodiments.

Figure 3:
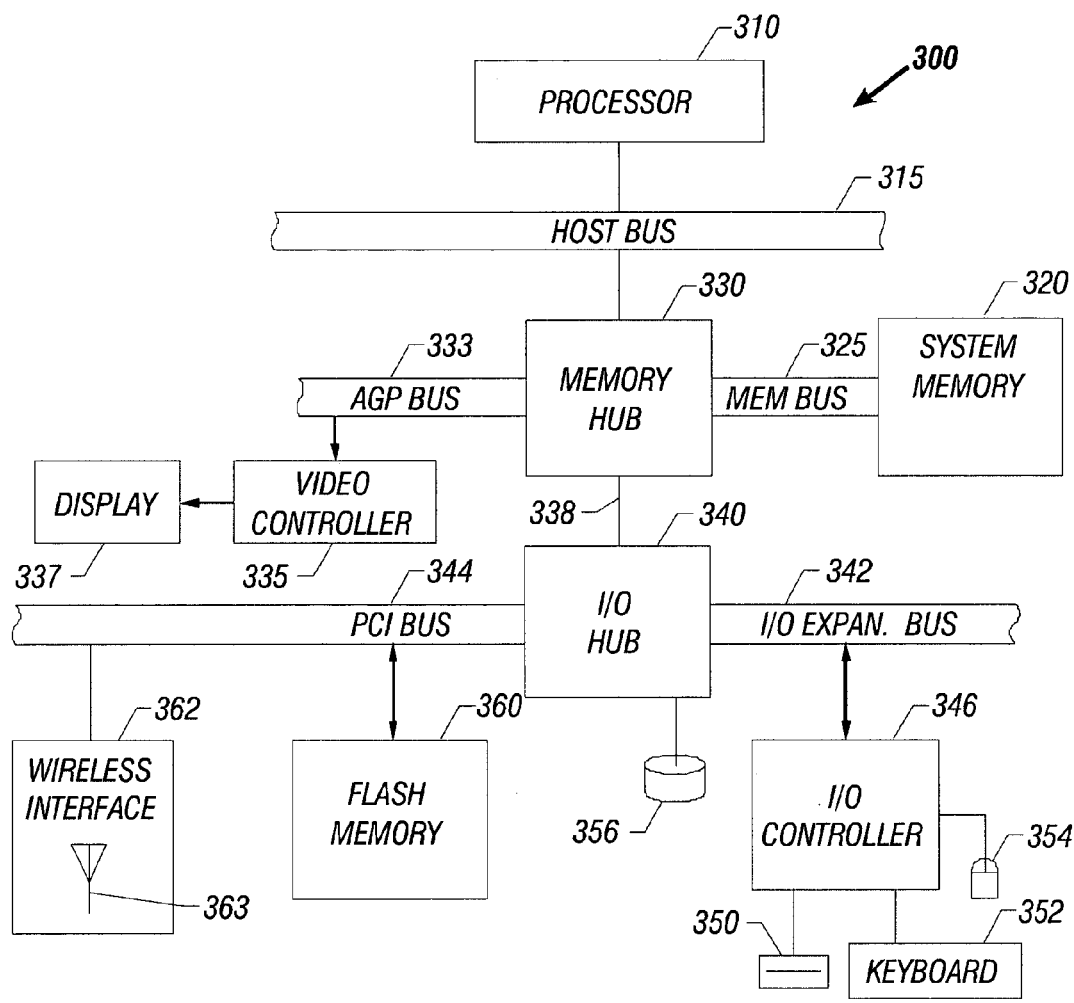
FIG. 3 is a block diagram of a system with which embodiments of the present invention may be used.

FIG. 3 is a block diagram of a representative data processing system, namely computer system 300 with which embodiments of the invention may be used. In one embodiment, computer system 300 includes a processor 310, which may include a general-purpose or special-purpose processor such as a microprocessor, microcontroller, application specific integrated circuit (ASIC), a programmable gate array (PGA), and the like.

The processor 310 may be coupled over a host bus 315 to a memory hub (i.e., a memory controller) 330 in one embodiment, which may be coupled to a system memory 320 via a memory bus 325. The memory hub 330 may also be coupled over an Advanced Graphics Port (AGP) bus 333 to a video controller 335, which may be coupled to a display 337. The AGP bus 333 may conform to the Accelerated Graphics Port Interface Specification, Revision 2.0, published May 4, 1998, by Intel Corporation, Santa Clara, Calif.

Memory hub 330 may control the transfer of information within system 300, e.g., between processor 310, memory hub 330, and memory 320. That is, memory hub 330 may generate control signals, address signals, and data signals that may be associated with a particular write or read operation to memory 320.

In some embodiments, memory hub 330 may be integrated with processor 310 and/or with memory 320. In alternate embodiments, memory hub 330 may be a discrete component or dedicated chip. In other embodiments, portions of the functionality of memory hub 330 may be implemented in processor 310 or in memory 320 as, for example, a software application, module, or routine.

The memory hub 330 may also be coupled (via a hub link 338) to an input/output (I/O) hub 340 that is coupled to a input/output (I/O) expansion bus 342 and a Peripheral Component Interconnect (PCI) bus 344, as defined by the PCI Local Bus Specification, Production Version, Revision 2.1 dated in June 1995, or alternately a bus such as the PCI Express bus, or another third generation I/O interconnect bus. The I/O expansion bus 342 may be coupled to an I/O controller 346 that controls access to one or more I/O devices. As shown in FIG. 3, these devices may include in one embodiment storage devices, such as a floppy disk drive 350 and input devices, such as keyboard 352 and mouse 354. The I/O hub 340 may also be coupled to, for example, a hard disk drive 356 as shown in FIG. 3. It is to be understood that other storage media may also be included in the system. In an alternate embodiment, the I/O controller 346 may be integrated into the I/O hub 340, as may other control functions.

The PCI bus 344 may be coupled to various components including, for example, a flash memory 360 which may include the structure shown in the block diagram of FIG. 1. Further shown in FIG. 3 is a wireless interface 362 coupled to the PCI bus 344, which may be used in certain embodiments to communicate with remote devices. As shown in FIG. 3, wireless interface 362 may include a dipole or other antenna 363 (along with other components not shown in FIG. 3). In various embodiments, wireless interface 362 may be coupled to system 300, which may be a notebook personal computer, via an external add-in card, or an embedded device. In other embodiments wireless interface 362 may be fully integrated into a chipset of system 300.

Although the description makes reference to specific components of the system 300, it is contemplated that numerous modifications and variations of the described and illustrated embodiments may be possible. More so, while FIG. 3 shows a block diagram of a system such as a notebook personal computer, it is to be understood that embodiments of the present invention may be implemented in another wireless device such as a cellular phone, personal digital assistant (PDA) or the like. In such embodiments, a flash memory in accordance with an embodiment may be coupled to an internal bus which is in turn coupled to a microprocessor and a peripheral bus, which may in turn be coupled to a wireless interface and an associated antenna such as a dipole antenna, helical antenna, global system for mobile communication (GSM) antenna, and the like.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   sensing a first burst length of data at a first initial address, the first burst length of data equal to half of a sense width of a plurality of sense amplifiers of a memory; and
   sensing a second burst length of data at a second initial address that is non-contiguous to the first initial address, the second burst length of data equal to the half of the sense width, at least partially during a latency before reading the first burst length of data.

2. The method of claim 1, wherein sensing the first burst length of data comprises sensing four double words of data.

3. The method of claim 1, further comprising sensing a third burst length of data equal to the half of the sense width after sensing the first burst length.

4. The method of claim 1, further comprising sensing a thirst burst length of data at a third initial address, wherein the third burst length of data is equal to the sense width of the plurality of sense amplifiers.

5. A method comprising:
   controlling a sense array of a memory to sense a first word group from a first address of the memory while controlling the sense array to sense a second word group from a second address of the memory, wherein the second address is at a non-continuous initial address with respect to the first address; and
   controlling the sense array to sense a third word group from a third address of the memory, wherein the third word group corresponds to the width of the first and second word groups combined.

6. The method of claim 5, wherein the first word group is half as wide as a sense width of the sense array of the memory.

7. The method of claim 5, further comprising synchronously reading the first word group and the second word group from the memory.

8. The method of claim 5, further comprising separating a request for the first word group from a request for the second word group by a predetermined number of clock cycles.

9. The method of claim 8, wherein the predetermined number equals four.

10. The method of claim 5, wherein the first word group comprises four double words.

11. The method of claim 5, further comprising using a first latch to latch the first address and a second latch to latch the second address.

12. A system comprising:
a memory having a sense array to overlappingly sense a first word group from a first initial address and a second word group from a second initial address, or to sense a third word group from a third initial address, wherein the third word group is twice as wide as the first word group; and
a dipole antenna coupled to the memory.

13. The system of claim 12, further comprising a first latency connter to track a latency associated with a read operation of the first word group, and a second latency counter to track a latency associated with a read operation of the second word group.

14. The system of claim 12, wherein the sense array has a width twice that of the first word group, and equal to that of the third word group.

15. The system of claim 12, further comprising a first output buffer coupled to a first portion of the sense array, the first portion corresponding to a width of the first word group.

16. The system of claim 12, further comprising a controller to configure the sense array to sense the first and second word groups or the third word group.

17. An apparatus comprising:
a memory array to store data;
a sense array coupled to the memory array to sense data from the memory array, wherein the sense array is configured to overlappingly sense first data groups from a plurality of non-contiguos initial addresses, each of the first data groups half as wide as a sense width of the sense array, or sense a second data group from a third initial address, wherein the second data group corresponds to the sense width of the sense array; and
a controller coupled to the sense array to configure the sense array based on a read request for data in the memory array.

18. The apparatus of claim 17, further comprising an output multiplexer coupled to the sense array.

19. The apparatus of claim 18, wherein the controller is to control the output multiplexer to output a first one of the first data groups sensed from a first one of the plurality of non-contiguous initial addresses while the sense array is to sense a second one of the first data groups from a second one of the plurality of non-contiguous initial addresses.

20. The apparatus of claim 17, further comprising a first latch to latch a first one of the plurality of non-contiguous initial addresses and a second latch to latch a second one of the plurality of non-contiguous initial addresses.

21. The apparatus of claim 17, further comprising a first latency counter to track a latency associated with a read operation of a first one of the first data groups, and a second latency counter to track a latency associated with a read operation of a second one of the first data groups.

22. The apparatus of claim 17, wherein the memory comprises a nonvolatile memory.

23. An article comprising a machine-readable storage medium containing instructions that if executed enable a system to:
control a sense array of a memory to sense a first word group from a first address of the memory while controlling the sense array to sense a second word group from a second address of the memory, wherein the second address is at a non-contiguous initial address with respect to the first address; and
control the sense array to sense a third word group from a third address of the memory, wherein the third word group corresponds to the width of the first and second word groups combined.

24. The article of claim 23, further comprising instructions that if executed enable the system to synchronously read the first word group and the second word group from the memory.

25. The article of claim 23, further comprising instructions that if executed enable the system to separate a request for the first word group from a request for the second word group by a predetermined number of clock cycles.

* * * * *

UNITED STATES PATENT AND TRADEMARK OFFICE
CERTIFICATE OF CORRECTION

| | | |
|---|---|---|
| PATENT NO. | : 7,191,295 B2 | Page 1 of 1 |
| APPLICATION NO. | : 10/610478 | |
| DATED | : March 13, 2007 | |
| INVENTOR(S) | : Shekoufeh Qawami et al. | |

It is certified that error appears in the above-identified patent and that said Letters Patent is hereby corrected as shown below:

Column 6:
Line 56, "non-continuous" should be --non-contiguous--.

Column 7:
Line 21, "connter" should be --counter--;
Line 39, "non-contiguos" should be --non-contiguous--.

Signed and Sealed this

Fourteenth Day of August, 2007

JON W. DUDAS
*Director of the United States Patent and Trademark Office*